(12) United States Patent
Curtis et al.

(10) Patent No.: US 11,272,643 B2
(45) Date of Patent: Mar. 8, 2022

(54) SYSTEM AND METHOD FOR THERMAL MANAGEMENT IN AN INFORMATION HANDLING SYSTEM

(71) Applicant: DELL PRODUCTS, L.P., Round Rock, TX (US)

(72) Inventors: Robert B. Curtis, Georgetown, TX (US); Mukund P. Khatri, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 121 days.

(21) Appl. No.: 16/834,253

(22) Filed: Mar. 30, 2020

(65) Prior Publication Data

US 2020/0229324 A1 Jul. 16, 2020

Related U.S. Application Data

(63) Continuation of application No. 15/947,353, filed on Apr. 6, 2018, now Pat. No. 10,694,645.

(51) Int. Cl.
*G06F 9/48* (2006.01)
*H05K 7/20* (2006.01)
*G06F 1/20* (2006.01)
*G05B 15/02* (2006.01)

(52) U.S. Cl.
CPC ......... *H05K 7/20836* (2013.01); *G05B 15/02* (2013.01); *G06F 1/206* (2013.01); *G06F 9/4893* (2013.01); *H05K 7/20209* (2013.01)

(58) Field of Classification Search
CPC .................................................... G06F 9/4893
See application file for complete search history.

(56) References Cited

U.S. PATENT DOCUMENTS

| 7,786,618 | B2 | 8/2010 | Cohen et al. | |
| 2009/0107577 | A1* | 4/2009 | Allidieres | F17C 7/00 141/1 |
| 2009/0138219 | A1 | 5/2009 | Bletsch et al. | |
| 2009/0303761 | A1* | 12/2009 | Radbrant | H02J 3/36 363/51 |
| 2014/0247154 | A1 | 9/2014 | Proud | |
| 2017/0273224 | A1 | 9/2017 | Shabbir et al. | |
| 2018/0108339 | A1 | 4/2018 | Young et al. | |

OTHER PUBLICATIONS

Hackenberg et al, Introducing FI Restarter: A Processor Stress Test Utility, 2013 International Green Computing Conference Proceedings, Arlington, VA, 2013, pp. 1-9. (Year: 2013).
Norton, Norton Security causing high CPU Usage I Norton Community, Norton, Jun. 2016 (Year: 2016).

* cited by examiner

*Primary Examiner* — Charlie Sun
(74) *Attorney, Agent, or Firm* — Larson Newman, LLP

(57) ABSTRACT

A method of thermally managing an information handling system includes executing a security scan to simulate a maximum workload consuming an electrical power, and receiving sensory signals representing temperatures associated with the information handling system. A system ambient capability above an ambient temperature when operating the information handling system at the maximum workload is then determined.

20 Claims, 8 Drawing Sheets

SYSTEM AND METHOD FOR THERMAL MANAGEMENT IN AN INFORMATION HANDLING SYSTEM

CROSS-REFERENCE TO RELATED APPLICATION

This application is a continuation of U.S. patent application Ser. No. 15/947,353 entitled "System and Method for Thermal Management in an Information Handling System," filed on Apr. 6, 2018, the disclosure of which is hereby expressly incorporated by reference in its entirety.

FIELD OF THE DISCLOSURE

The present disclosure generally relates to information handling systems, and more particularly relates to thermal management in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

Excess thermal margins are determined for maximum workloads and for normal, everyday customer workloads. When servers and other information handling systems are less populated with power-consuming components, operating temperatures may be increased due to less internal waste heat. Moreover, a customer's realistic usage may also yield additional temperature margins representing normal, everyday customer workloads. Excess thermal margin is used to determine a supported ambient temperature for either a maximum workload and/or a user/customer workload. For example, the customer's realistic usage aligns the temperature in the data center with the IT equipment—ideally increased data center temperatures and thus reduced cooling costs. Servers that support higher ambient temperatures can also be moved to hotter regions of the data center.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
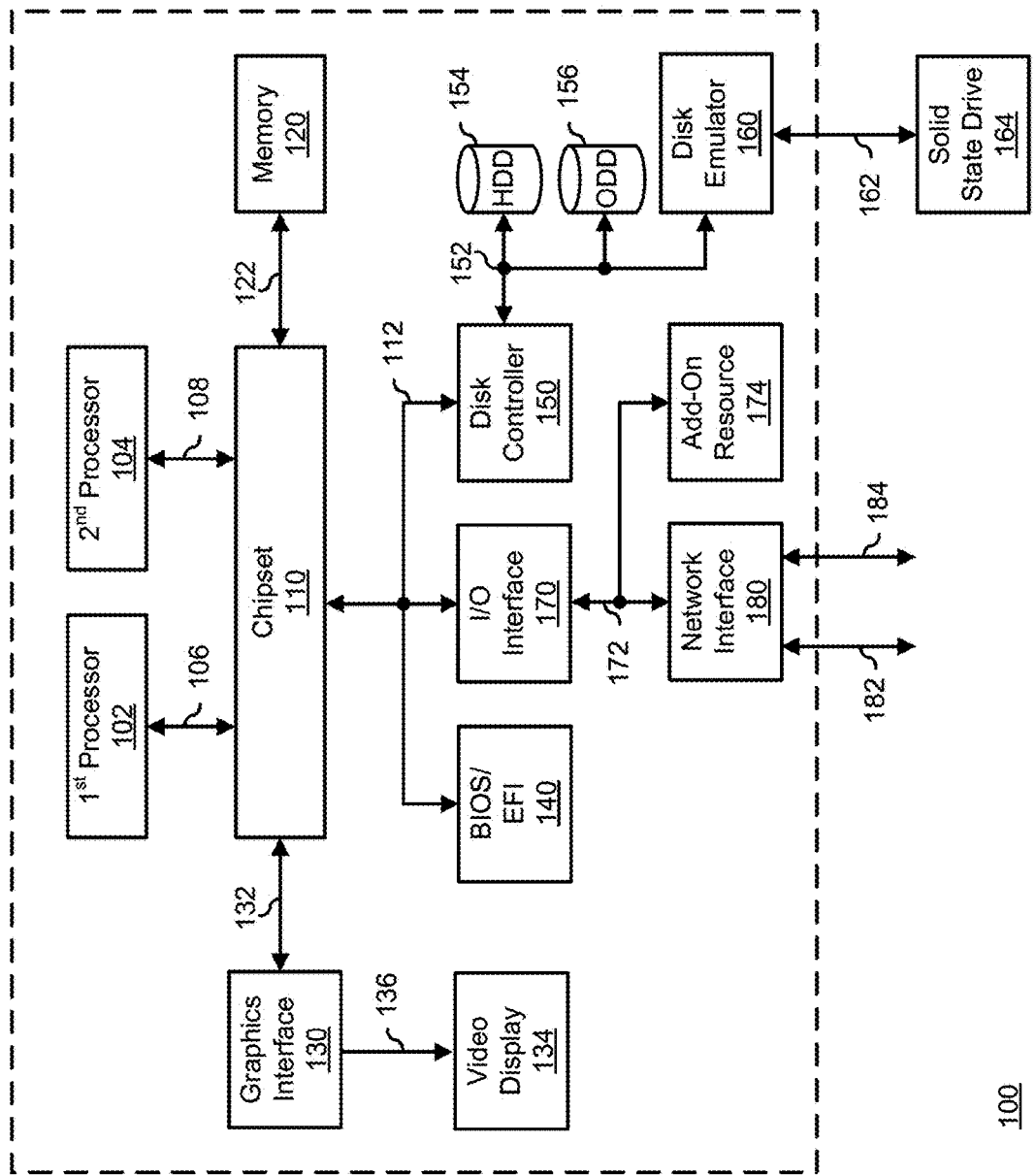
FIG. 1 is a block diagram illustrating an information handling system according to an embodiment of the present disclosure.

FIG. 1 shows an information handling system 100 that includes one or more processors (such as reference numerals 102 and 104), a chipset 110, a memory 120, a graphics interface 130, a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, the information handling system 100 includes separate memories that are dedicated to each of the processors 102 and 104 via separate memory interfaces. An example of the memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources.

Disk controller 150 includes a disk interface 152 that connects the disk controller 150 to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within the information handling system 100, on a main circuit board of the information handling system 100, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Figure 2:
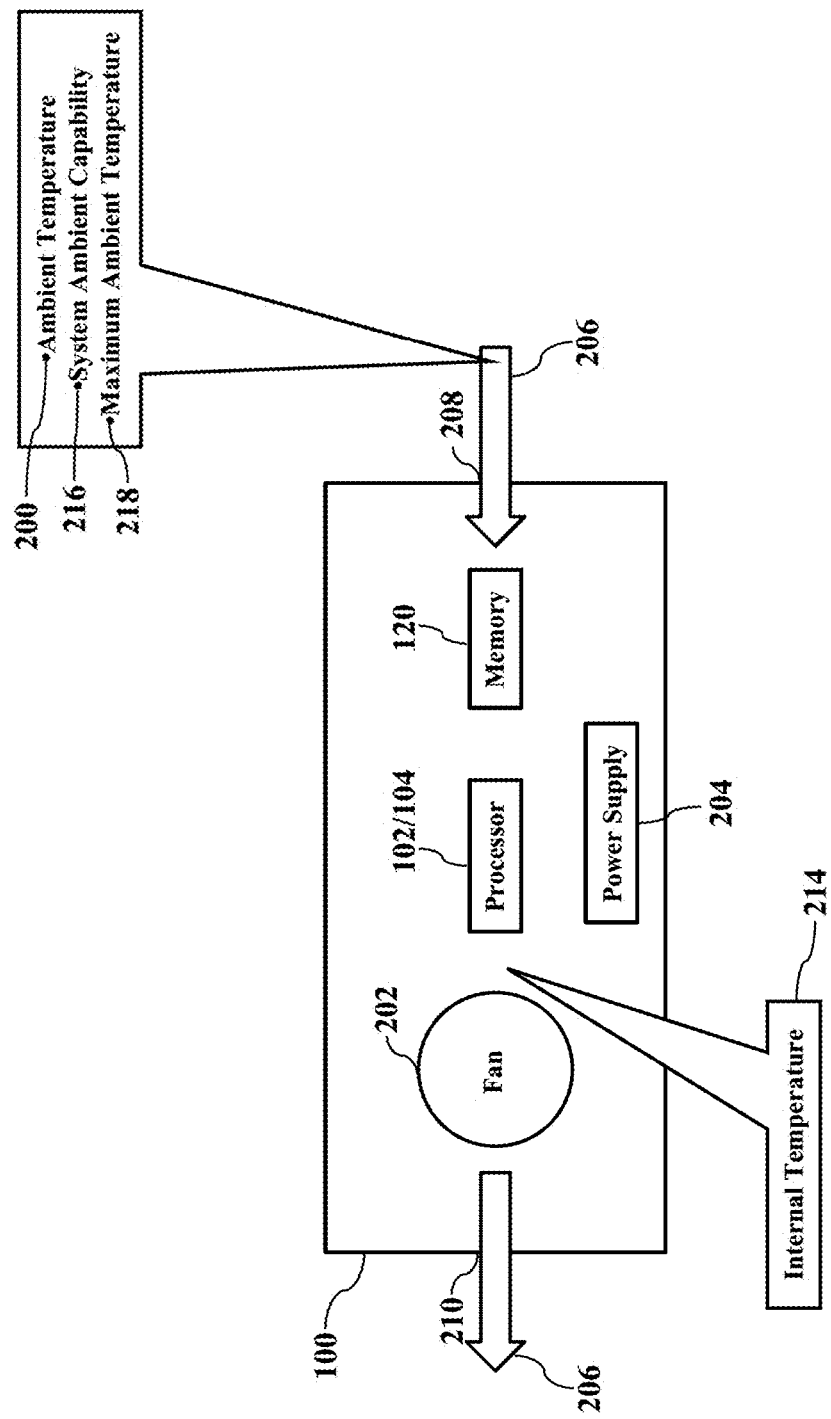
FIG. 2 is a schematic illustration of thermal management, according to exemplary embodiments.

FIG. 2 shows thermal management of an information handling system, according to exemplary embodiments. Here exemplary embodiments determine a maximum value of an ambient temperature 200 for an operation of the information handling system 100. As the reader may understand, the information handling system 100 has one or more internal fans 202. When the fan 202 receives electrical power (such as via a connection to a power supply 204), the fan 202 spins and moves air 206 from an inlet 208 to an outlet 210. As the air 206 flows, the air 206 provides convective cooling of the internal components (such as the processors 102/104 and the memory device 120) within the information handling system 100. The fan 202 thus removes waste heat from an interior region of the information handling system 100.

The air 206 has the ambient temperature 200. That is, the air 206 drawn from the inlet 208 has the ambient temperature 200, and the ambient temperature 200 may affect the performance and operation of the information handling system 100. As the ambient temperature 200 increases, an internal temperature 214 within the information handling system 100 also likely increases. In simple words, the performance of the information handling system 100 may be affected by the ambient temperature 200, which is well known and need not be explained in detail. Exemplary embodiments thus determine a system ambient capability 216, which may be represented as a maximum value 218 of the ambient temperature 200 at the inlet 208, based on the internal hardware componentry within the information handling system 100.

Conventional environmental specifications may be unrealistic. Many processor-controlled systems are typically sold with an environmental specification supporting ambient temperature values of 30° C., 35° C., or even 40-45° C. (if Fresh Air compliant). These environmental specifications, though, are based on a fully populated system. These environmental specifications are also based on an operation under a workload at a maximum power (such as a power virus or a LINPACK® benchmark performance test). These environmental specifications thus do not reflect any thermal margin that may exist across various configurations, especially particular systems that are not fully populated with all available components (solid state or hard disk drives, PCIe cards, and other peripheral devices). In other words, lesser populated systems will have a thermal margin that would allow for operation at higher values of the ambient temperature 200. Moreover, most real-world workloads do not fully utilize the capabilities of the processor 102/104, the memory 120, and other components, so the system actual ambient capability 216 may be even higher. With this knowledge of this higher system ambient capability 216, the user can take a number of actions which will provide varying benefits of efficiency.

Exemplary embodiments determine the maximum ambient temperature 218 under actual and maximum workload conditions. The maximum ambient temperature 218 is the maximum system inlet temperature at which a particular system configuration of the information handling system 100 can operate, while still maintaining proper cooling of the internal hardware. When the maximum ambient temperature 218 is determined, exemplary embodiments may, or may not, operate the fan(s) 202 at 100% speed or electrical power. If the ambient temperature 200 equals or exceeds the maximum ambient temperature 218, then exemplary embodiments may throttle down or reduce performance or capabilities to maintain proper cooling.

The maximum ambient temperature 218 may vary based on workload. When the workload is greatest (such as executing a power virus, a UNPACK® benchmark performance test, virus scan, or malware protection), the system ambient capability 216 may have a low or lowest value or measure. An actual or more normal workload (such as consuming less electrical power) may allow for higher measures or values of the system ambient capability 216. The knowledge of this higher system ambient capability 216 (under the real-world customer workload) is especially valuable for customers with configurations on the high-end of the power or density spectrum. Exemplary embodiments may thus use thermal telemetry data to determine the maximum ambient temperature 218 that can be supported for a particular chassis configuration.

Figure 3:
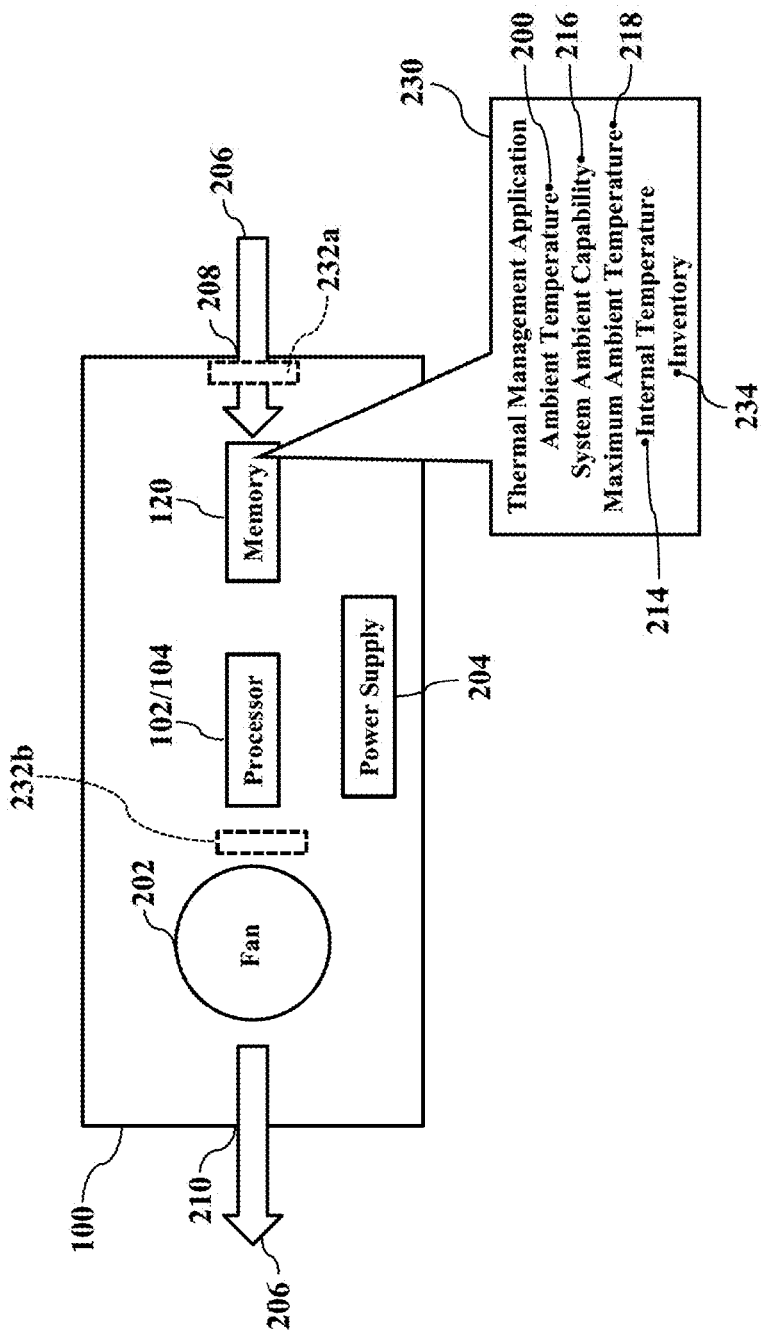
FIG. 3 is a more detailed illustration of thermal management, according to exemplary embodiments

FIG. 3 is a more detailed illustration of thermal management, according to exemplary embodiments. FIG. 3 illustrates the processor 102/104 executing a thermal management application 230 stored in the memory device 120. The thermal management application 230 has code or instructions that cause the processor 102/104 to perform operations, such as executing the thermal management application 230 to determine and report the maximum ambient temperature 218. The thermal management application 230, for example, may interface with temperature sensors 232 to determine the maximum ambient temperature 218. While there may be many different temperature sensors 232, FIG. 3 only illustrates a simple example with two (2) temperature sensors 232a and 232b. The thermal management application 230 receives a sensory signal or output generated by the inlet temperature sensor 232a. The inlet temperature sensor 232a is installed at any location at or proximate to the inlet 208. The inlet temperature sensor 232a thus provides data or information representing the ambient temperature 200 of the air 206 entering the inlet 208.

Internal temperatures may also be measured and/or estimated. As FIG. 3 also illustrates, the thermal management application 230 may also receive a sensory signal or output generated by the internal chassis temperature sensor 232b. The chassis temperature sensor 232b provides data or information representing the internal temperature 214 within the information handling system 100. The internal temperature 214 is thus affected by both the ambient temperature 200 of the air 206 entering the inlet 208 and the waste heat generated by the internal components operating within the information handling system 100. The thermal management application 230 may thus use the temperature values of the ambient temperature 200 and/or the internal temperature 214, along with a system inventory 234 of the information handling system 100, to determine the maximum ambient temperature 218.

Figure 4:
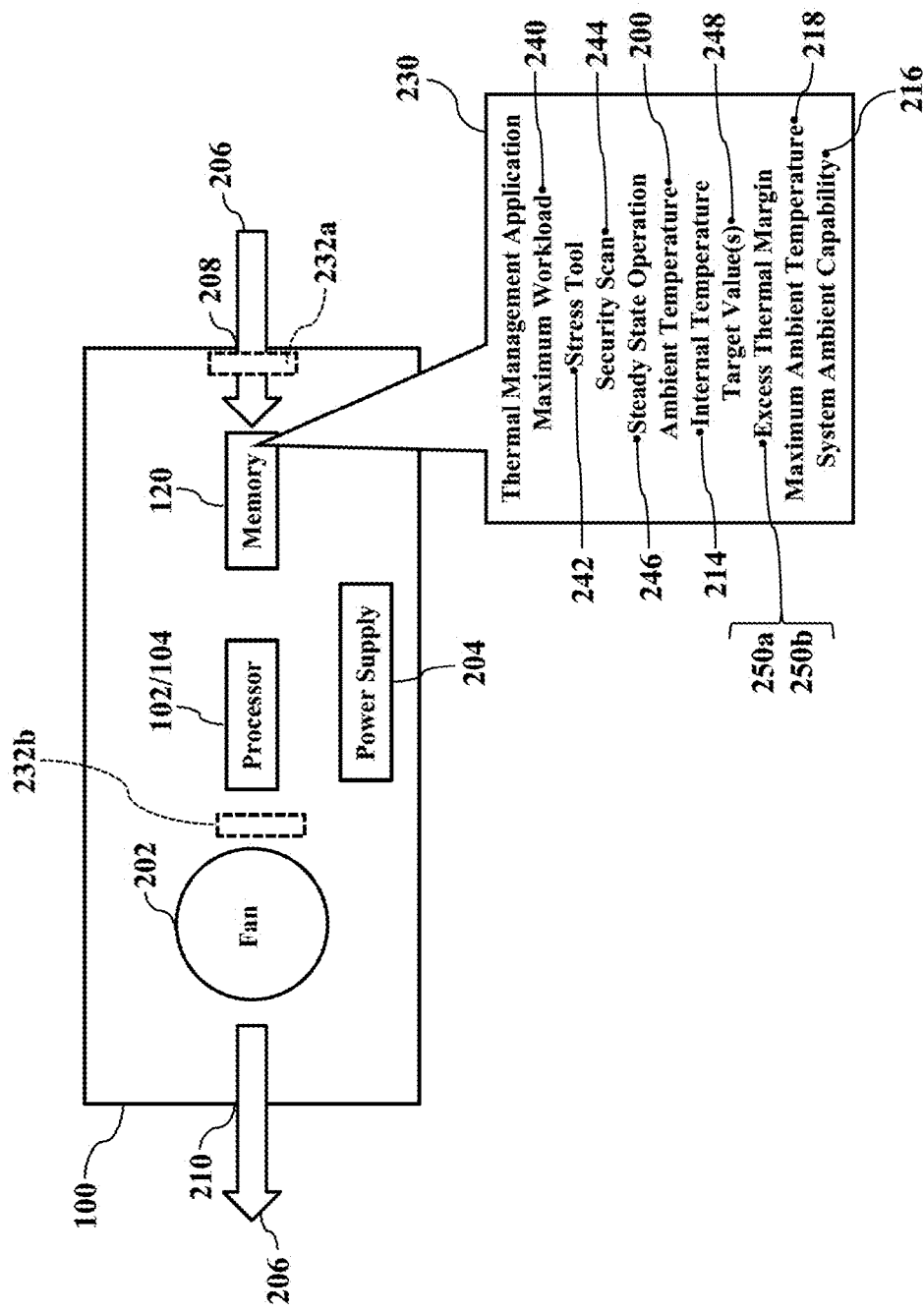
FIG. 4 is a schematic illustration of thermal management during a maximum workload, according to exemplary embodiments.

FIG. 4 illustrates a maximum workload 240, according to exemplary embodiments. Here the thermal management application 230 may instruct or cause the information handling system 100 to run or execute a stress tool 242. The stress tool 242 is a software module or subroutine that simulates the maximum workload 240 experienced by the information handling system 100. The stress tool 242 may automatically run/execute, or the user of the information handling system 100 may schedule a day/time for the stress tool 242 to execute. The stress tool 242 causes the information handling system 100 to operate at the maximum workload 240 by utilizing the full, or nearly full, capabilities of the processor 102/104, the memory 120, hard disk drive(s), PCIe peripheral cards, fan(s), and other components (perhaps consuming the full, or nearly full, electrical power produced by the power supply 204).

A security scan 244 is a common example. While the maximum workload 240 may be configured as desired, most readers are thought familiar with a virus protection. The security scan 244 inspects files, software, and/or hardware for suspicious malware, viruses, and activity. As the reader may understand, the security scan 244 may be one of the most intensive or taxing hardware and software operations or tasks, so the security scan 244 can be a proxy for the maximum workload 240 experienced by the information handling system 100. Regardless, the stress tool 242 causes the information handling system 100 to operate near or at full capability for a duration of time that is sufficient to obtain a steady state operation 246. Moreover, the stress tool 242 may also operate the fan(s) 202 at a maximum speed and/or electrical power consumption to maximize cooling capabilities during the maximum workload 240. The thermal management application 230 monitors and records/logs the ambient temperature 200 and the internal temperature 214 during the steady state operation 246. The thermal management application 230 may then compare the ambient temperature 200 and/or the internal temperature 214 to one or more target values 248 (perhaps stored and/or retrieved from the memory 120). Any positive difference between the ambient temperature 200 and/or the internal temperature 214 and the target value(s) 248 is defined as an excess thermal margin 250a-b for each temperature sensor 232a-b. The thermal management application 230 may select the smaller or lesser excess thermal margin 250a or 250b. The thermal management application 230 may then add the ambient temperature 200 to the smallest excess thermal margin (250a or 250b) to determine the system ambient capability 216 as the maximum ambient temperature 218 for the maximum workload 240.

Figure 5:
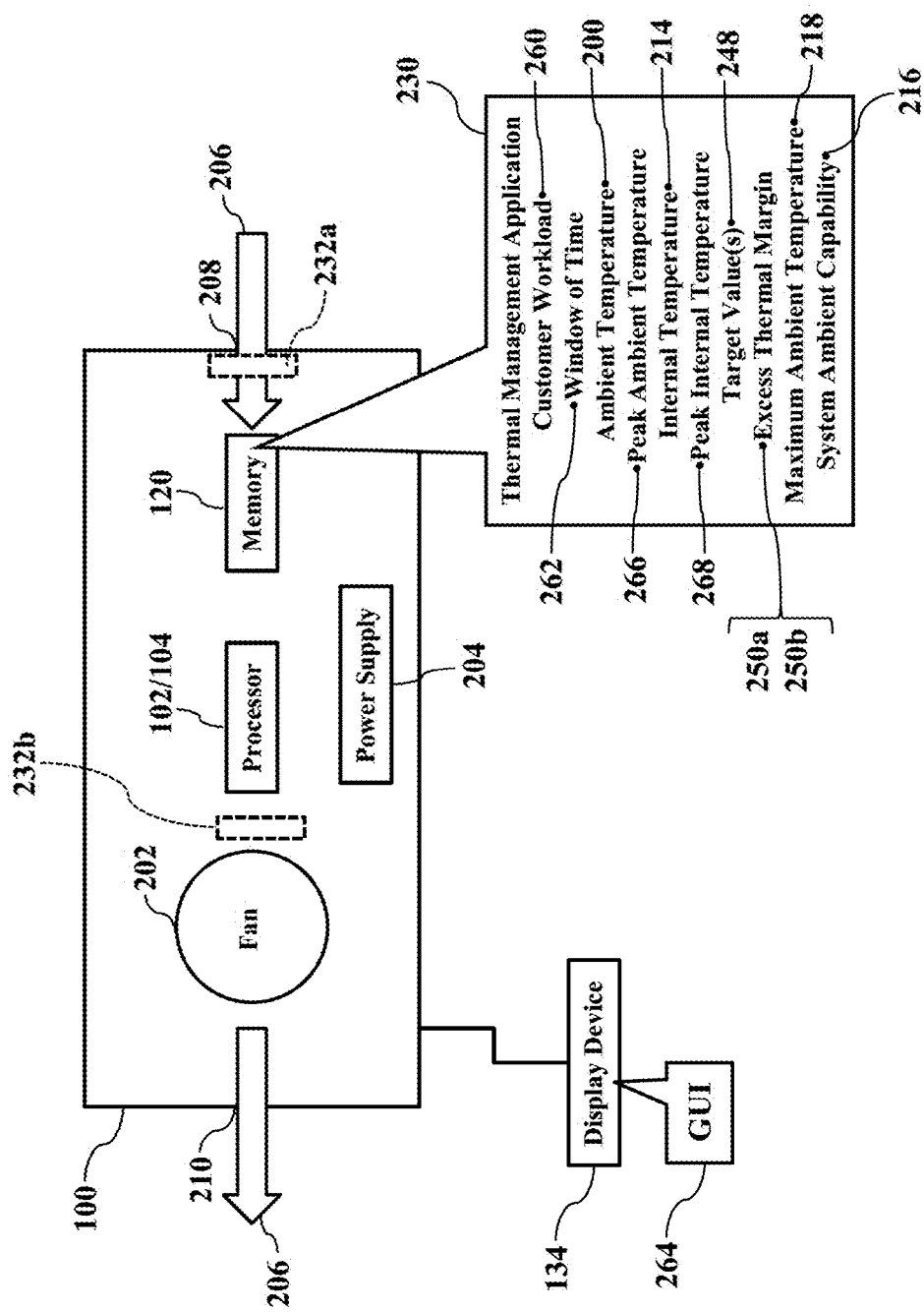
FIG. 5 is a schematic illustration of thermal management during a customer workload, according to exemplary embodiments.

FIG. 5 illustrates a customer workload 260, according to exemplary embodiments. Here the user defines a window 262 of time to evaluate a more normal or everyday customer workload 260 of the information handling system 100. For example, the thermal management application 230 causes the information handling system 100 to generate and to display a graphical user interface (GUI) 264 on the display device 134. The graphical user interface 264 presents a visual or audible prompt for the user to input the window 262 of time during which the customer workload 260 is monitored. The user would then perform normal, everyday tasks (e.g., software applications) representing normal, everyday usage. As the window 262 of time increments from an initial time to an expiration time, the thermal management application 230 monitors, logs, and/or records various measures of usage. The thermal management application 230 may also operate the fan(s) 202 at a maximum speed and/or electrical power consumption for maximum cooling effect. The thermal management application 230 monitors and records/logs the ambient temperatures 200 and the internal temperatures 214 measured during the window 262 of time. When the window 262 of time expires (at the final expiration time), the thermal management application 230 may review the ambient temperatures 200 recorded during the window 262 of time and select a largest or peak value 266. The thermal management application 230 may additionally or alternatively review the internal temperatures 214 logged during the window 262 of time and select its corresponding largest or peak value 268. The thermal management application 230 may then compare the peak values 266 and/or 268 to their respective target values 248. Again, any positive difference may be the excess thermal margin values 250a-b for each corresponding temperature sensor 232a-b. The thermal management application 230 may select the smaller or lesser excess thermal margin value 250a or 250b and adds to the peak value 266 of the ambient temperature 200 to determine the maximum ambient temperature 218 for the actual or customer workload 260.

Figure 6:
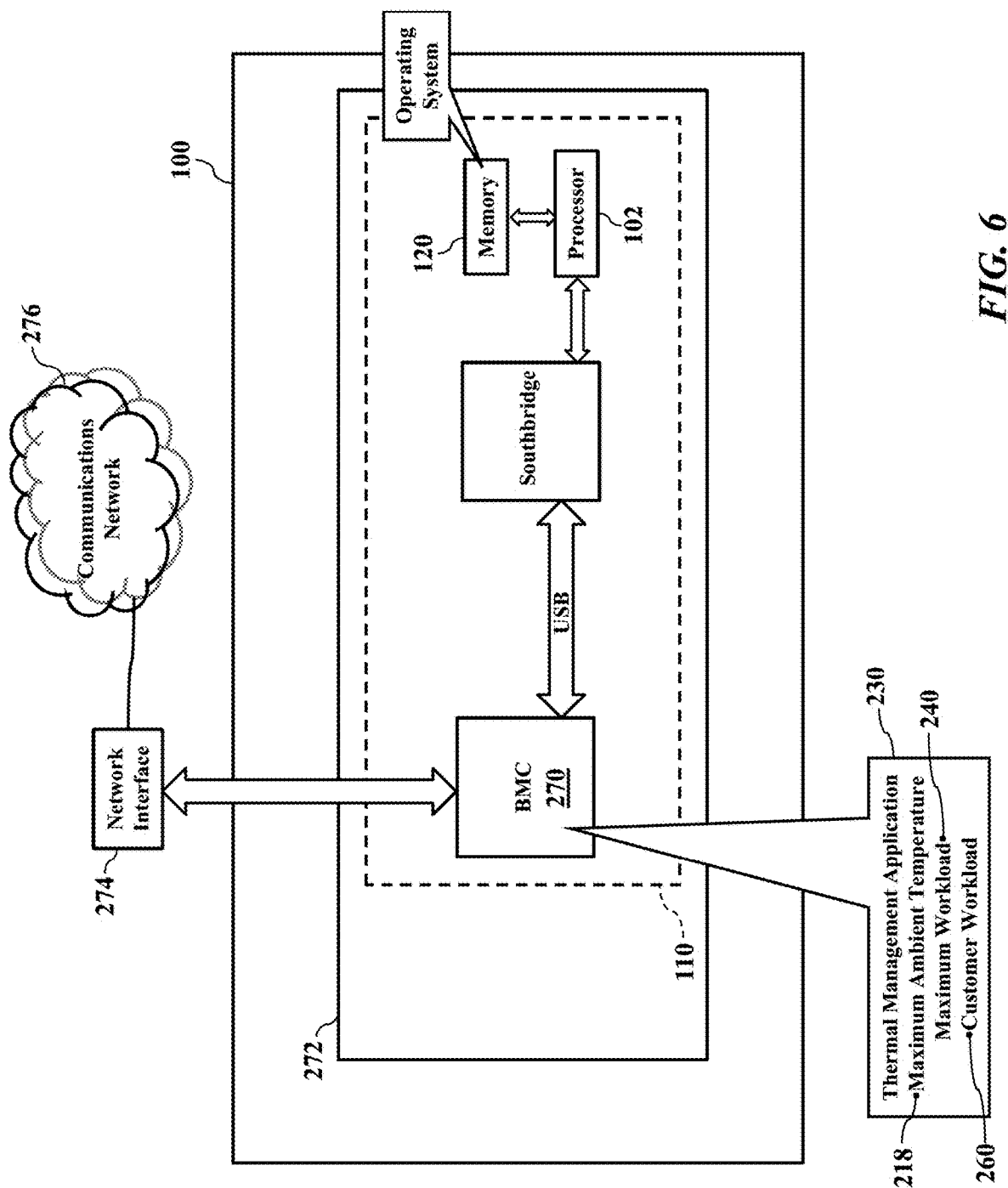
FIG. 6 is a schematic illustration of thermal management by a baseboard management controller, according to exemplary embodiments.

FIG. 6 further illustrates thermal management, according to exemplary embodiments. Here a baseboard management controller (BMC) 270 may execute the thermal management application 230. That is, the information handling system 100 has a motherboard 272 comprising the chipset 110. However, the information handling system 100 may also have the separate baseboard management controller 240. As those of ordinary skill in the art understand, the baseboard management controller 270 interfaces with the motherboard 272 to provide side-band and out-of-band remote management of the information handling system 100. The baseboard management controller 270 has one or more physical communications links and interfaces to the motherboard 272, thus allowing the baseboard management controller 270 to process messages according to the Intelligent Platform Management Interface (IPMI) specification. The baseboard management controller 270 may thus monitor and report the functions and performance of the information handling system 100 via a separate network interface 274 to a communications network 276. The IPMI specification is generally well known and thus need not be explained in detail. Regardless, the baseboard management controller 270 may determine the maximum ambient temperature 218 for the maximum workload 240 and for the customer workload 260, as above explained.

Figure 7:
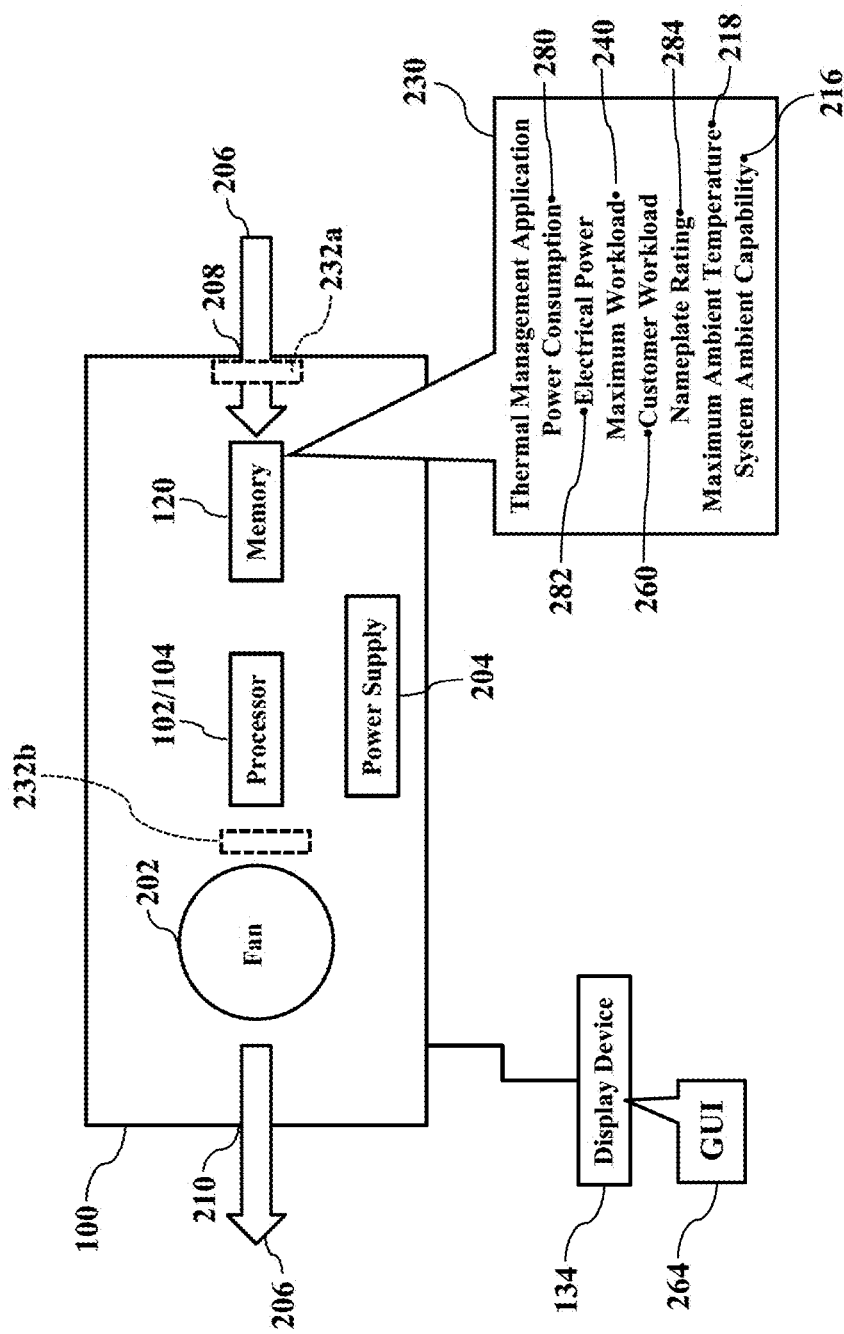
FIG. 7 is a schematic illustration of power monitoring, according to exemplary embodiments.

FIG. 7 illustrates power monitoring, according to exemplary embodiments. Here exemplary embodiments may also record or log values representing a power consumption 280 of electrical power 282 during testing. That is, as exemplary embodiments simulate the maximum workload 240 (as above explained with reference to FIG. 4), exemplary embodiments may log and record the electrical power 282 consumed by the information handling system 100. Similarly, as exemplary embodiments monitor the customer workload 260 (as above explained with reference to FIG. 5), exemplary embodiments may log and record the electrical power 282 consumed by the information handling system 100. As the reader may understand, the information handling system 100 may have functional capabilities to read an amount of the electrical power 282 that is being generated by the power supply 204 and/or that is being consumed by internal componentry (such as the processor 102/104, the memory device 120, and HDDs). Exemplary embodiments may thus use this capability to further determine the system ambient capability 216 based on the maximum ambient temperature 218 for the maximum workload 240 and for the customer workload 260.

A nameplate rating 284 may be used. As the reader may understand, most computers, servers, mobile devices, and other information handling systems 100 have the nameplate rating 284. The nameplate rating 284 is usually stored as data in the memory 120. The nameplate rating 284 indicates how much of the electrical power 282 may be consumed or used by the information handling system 100, perhaps according to different operating conditions. As exemplary embodiments monitor the electrical power 282 during testing of the maximum workload 240 and/or the customer workload 260, exemplary embodiments may compare actual, real-time power consumption 280 to the nameplate rating 284.

Power consumption may be presented to the user. Exemplary embodiments may display (such as via the graphical user interface 264 on the display device 134) the actual, real-time power consumption 280 monitored during the maximum workload 240 and/or the customer workload 260. Exemplary embodiments may also display the maximum ambient temperature 218 for the maximum workload 240 and for the customer workload 260. Exemplary embodiments may also compare the power consumption 280 to the nameplate rating 284. For example, a nameplate ambient rating may be an informational component of the nameplate rating 284 and may be stored in the memory device 120 (such as a thermal data table for various operating conditions). The thermal management application 230 may add an entry to the thermal data table describing the system ambient capability 216 for the maximum workload 240, which may be a new value based on actual installed hardware operating under a maximum stress workload. Likewise, the thermal management application 230 may add another entry to the thermal data table describing the system ambient capability 216 for the customer workload 260, which is another value based on actual installed hardware operating under the real-world user workload.

The information handling system 100 for example may have a 250 Watt central processing unit, and any non-volatile memory devices would normally be limited to a 25° C. ambient temperature. In this case, 25° C. is the ambient nameplate rating 284 (retrieved from the thermal management table stored in the memory device 120), with the 25° C. based on all hard disk drive (HDD) slots being populated. However, if the customer/user only ordered two (2) HDDs, with all other slots empty, this results in reduced preheat (from 5° C. preheat with all drives down to just 2° C. with only the two drives installed.) to downstream components. This 3° C. reduction in preheat is a first excess thermal margin 250. At the maximum workload 240, then, exemplary embodiments allow the information handling system 100 to operate at 25° C.+3° C.=28° C. due to the reduced HDD count.

The customer workload 260 also benefits. When the information handling system 100 operates at the customer workload 260, the central processing unit may consume less electrical power (perhaps 210 Watts). Less power is consumed and less waste heat is generated, thus allowing a second excess thermal margin 250 of ~6° C. (assuming 0.16 C/W heatsink capability). The information handling system 100 is able to operate at (25° C.+3° C.+6° C.) for a cumulative total of 34° C.

Exemplary embodiments thus present an elegant solution. Conventional thermal management schemes do not account for the increased thermal margin 250 based on the actual component inventory 234, the maximum workload 240 of the installed configuration, and on the realistic customer workload 260. Simply put, the user/customer is unaware of the increased ambient temperature capability. Because the maximum ambient temperature 218 may be based on actual load and use, exemplary embodiments stretch performance capabilities using real world scenarios. For example, the increased thermal margin 250 allows for increased data center temperatures, which results in lower data center cooling costs. Servers and other information handling systems 100 supporting higher ambient temperatures may be re-located to hotter regions of the data center. Conversely, server systems with lower ambient temperature limits can be moved to cooler locations within the data center. Moreover, customers can fit more server systems in a rack with knowledge of the maximum and customer workload power verses just the nameplate power rating 218.

Figure 8:
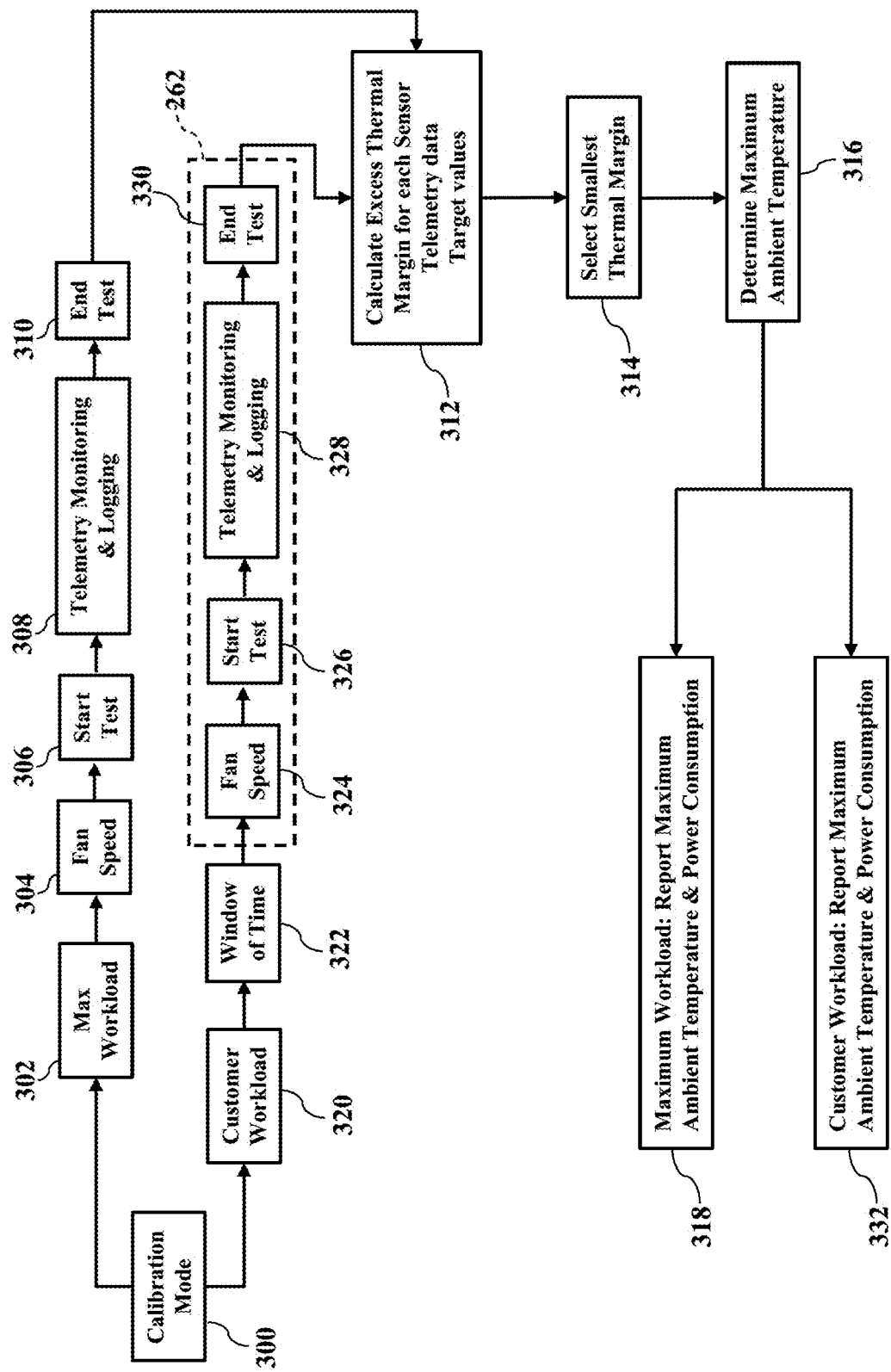
FIG. 8 is a schematic illustration of a method or process for thermal management, according to exemplary embodiments.

FIG. 8 illustrates a method or process for thermal management, according to exemplary embodiments. A calibration mode determines the test to be run (Block 300). A user, for example, may select (perhaps via the graphical user interface 264 on the display device 134) whether the maximum workload 240 is executed (Block 302) or whether the customer workload 260 is executed (Block 302). The calibration mode, of course, may also be automatically executed by the thermal management application 230, based on some configuration parameter. If the test for the maximum workload 240 is selected, the fan 202 is commanded to operate at full speed and/or the electrical power 282 (e.g., current and/or voltage) (Block 304). The test for the maximum workload 240 is started (Block 306) and telemetry data (e.g., the ambient temperatures 200, the internal temperatures 214, and the power consumption 280) is monitored and logged (Block 308). The test for the maximum workload 240 then ends (Block 310). The telemetry data is compared to the target values 248 to determine the excess thermal margin 250 for each temperature sensor 232 (Block 312). The smallest or least excess thermal margin 250 is selected (Block 314) and added to the ambient temperature 200 to determine the system ambient capability 216 as the maximum ambient temperature 218 for the maximum workload 240 (Block 316). Any of the telemetry data, the system ambient capability 216, and the maximum ambient temperature 218 for the maximum workload 240 may then be reported (such as display via the graphical user interface 264) (Block 318).

The test for the customer workload 260 may also be executed (Block 320). The user and/or the thermal management application 230 may define the window 262 of time (Block 322). When the window 262 of time commences, the fan 202 is commanded to operate at full speed and/or the electrical power 282 (e.g., current and/or voltage) (Block 324), the test for the customer workload 260 is started (Block 326), the telemetry data is monitored and logged (Block 328), and the test ends (Block 330) at the expiration of the window 262 of time. The telemetry data is compared to the target values 248 to determine the excess thermal margin 250 for each temperature sensor 232 (Block 312). The smallest or least excess thermal margin 250 is selected (Block 314) and added to the ambient temperature 200 to determine the system ambient capability 216 as the maximum ambient temperature 218 for the customer workload 260 (Block 316). Any of the telemetry data, the system ambient capability 216, and the maximum ambient temperature 218 for the customer workload 260 may then be reported (such as display via the graphical user interface 264) (Block 332).

Exemplary embodiments may packetize. The information handling system 100 and the baseboard management controller 270 may interface with a local area network and/or a wide area network (such as the Internet). Messages and data may be packetized into packets of data according to a packet protocol, such as the Internet Protocol. The packets of data contain bits or bytes of data describing the contents, or payload, of a message. A header of each packet of data may contain routing information identifying an origination address and/or a destination address. There are many different known packet protocols, and the Internet Protocol is widely used, so no detailed explanation is needed.

Exemplary embodiments may be applied regardless of networking environment. Exemplary embodiments may be easily adapted to stationary or mobile devices having cellular, WI-FI®, near field, and/or BLUETOOTH® capability. Exemplary embodiments may be applied to devices utilizing any portion of the electromagnetic spectrum and any signaling standard (such as the IEEE 802 family of standards, GSM/CDMA/TDMA or any cellular standard, and/or the ISM band). Exemplary embodiments, however, may be applied to any processor-controlled device operating in the radio-frequency domain and/or the Internet Protocol (IP) domain. Exemplary embodiments may be applied to any processor-controlled device utilizing a distributed computing network, such as the Internet (sometimes alternatively known as the "World Wide Web"), an intranet, the local-area network (LAN), and/or a wide-area network (WAN). Exemplary embodiments may be applied to any processor-controlled device utilizing power line technologies, in which signals are communicated via electrical wiring. Indeed, exemplary embodiments may be applied regardless of physical componentry, physical configuration, or communications standard(s).

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

For purpose of this disclosure the information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, the information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, the information handling system 100 can include processing resources for executing machine-executable code, such as a central processing unit (CPU), a programmable logic array (PLA), an embedded device such as a System-on-a-Chip (SoC), or other control logic hardware. The information handling system 100 can also include one or more computer-readable medium for storing machine-executable code, such as software or data. Additional components of the information handling system 100 can include one or more storage devices that can store machine-executable code, one or more communications ports for communicating with external devices, and various input and output (I/O) devices, such as a keyboard, a mouse, and a video display. The information handling system 100 can also include one or more buses operable to transmit information between the various hardware components.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system, comprising:
   a hardware processor; and
   a memory device accessible to the hardware processor, the memory device storing instructions that when executed cause the hardware processor to perform operations including:
      executing a security scan simulating a maximum workload consuming electrical power;
      determining an ambient air temperature during the executing of the security scan simulating the maximum workload; and
      estimating a capability of the information handling system above the ambient air temperature during the executing of the security scan simulating the maximum workload.

2. The information handling system of claim 1, wherein the operations further comprise commanding a fan to operate.

3. The information handling system of claim 1, wherein the operations further comprise commanding a fan to operate during the executing of the security scan simulating the maximum workload.

4. The information handling system of claim 1, wherein the operations further comprise commanding a fan to operate at a full speed during the executing of the security scan simulating the maximum workload.

5. The information handling system of claim 1, wherein the operations further comprise receiving a signal representing the ambient air temperature.

6. The information handling system of claim 1, wherein the operations further comprise receiving a signal generated by a temperature sensor, the signal representing the ambient air temperature.

7. The information handling system of claim 1, wherein the operations further comprise determining an excess thermal margin during the executing of the security scan simulating the maximum workload.

8. A method of thermally managing an information handling system, comprising:
   executing, by a hardware processor, a security scan simulating a maximum workload consuming electrical power;
   determining an ambient air temperature during the executing of the security scan simulating the maximum workload; and
   estimating a capability of the information handling system above the ambient air temperature during the executing of the security scan simulating the maximum workload.

9. The method of claim 8, further comprising commanding a fan to operate.

10. The method of claim 8, further comprising commanding a fan to operate during the executing of the security scan simulating the maximum workload.

11. The method of claim 8, further comprising commanding a fan to operate at a full speed during the executing of the security scan simulating the maximum workload.

12. The method of claim 8, further comprising receiving a signal representing the ambient air temperature.

13. The method of claim 8, further comprising receiving a signal generated by a temperature sensor, the signal representing the ambient air temperature.

14. The method of claim 8, further comprising determining an excess thermal margin during the executing of the security scan simulating the maximum workload.

15. A non-transitory computer-readable device storing instructions that when executed cause a hardware processor to perform operations, the operations comprising:
   executing a security scan simulating a maximum workload consuming electrical power;
   determining an ambient air temperature during the executing of the security scan simulating the maximum workload; and
   estimating a capability of an information handling system above the ambient air temperature during the executing of the security scan simulating the maximum workload.

16. The non-transitory computer-readable device of claim 15, wherein the operations further comprise commanding a fan to operate.

17. The non-transitory computer-readable device of claim 15, wherein the operations further comprise commanding a fan to operate during the executing of the security scan simulating the maximum workload.

18. The non-transitory computer-readable device of claim 15, wherein the operations further comprise commanding a fan to operate at a full speed during the executing of the security scan simulating the maximum workload.

19. The non-transitory computer-readable device of claim 15, wherein the operations further comprise receiving a signal representing the ambient air temperature.

20. The non-transitory computer-readable device of claim 15, wherein the operations further comprise receiving a signal generated by a temperature sensor, the signal representing the ambient air temperature.

\* \* \* \* \*

UNITED STATES PATENT AND TRADEMARK OFFICE
CERTIFICATE OF CORRECTION

PATENT NO. : 11,272,643 B2  
APPLICATION NO. : 16/834253  
DATED : March 8, 2022  
INVENTOR(S) : Robert B. Curtis et al.

Page 1 of 1

It is certified that error appears in the above-identified patent and that said Letters Patent is hereby corrected as shown below:

In the Claims

Column 12, Line 43: Please change "computer-readable device" to --computer-readable medium--

Column 12, Line 54: Please change "computer-readable device" to --computer-readable medium--

Column 12, Line 57: Please change "computer-readable device" to --computer-readable medium--

Column 12, Line 61: Please change "computer-readable device" to --computer-readable medium--

Column 12, Line 65: Please change "computer-readable device" to --computer-readable medium--

Column 13, Line 1: Please change "computer-readable device" to --computer-readable medium--

Signed and Sealed this  
Eighth Day of July, 2025

Coke Morgan Stewart  
*Acting Director of the United States Patent and Trademark Office*